(12) United States Patent
Yoshida

(10) Patent No.: US 6,996,020 B2
(45) Date of Patent: Feb. 7, 2006

(54) SEMICONDUCTOR MEMORY DEVICE

(75) Inventor: Katsuya Yoshida, Kawasaki (JP)

(73) Assignee: Fujistu Limited, Kawasaki (JP)

( * ) Notice: Subject to any disclaimer, the term of this patent is extended or adjusted under 35 U.S.C. 154(b) by 127 days.

(21) Appl. No.: 10/720,080

(22) Filed: Nov. 25, 2003

(65) Prior Publication Data

US 2004/0114424 A1      Jun. 17, 2004

(30) Foreign Application Priority Data

Dec. 17, 2002   (JP) .............................. 2002-365634

(51) Int. Cl.
*G11C 7/02*        (2006.01)
(52) U.S. Cl. .................. 365/210; 365/230.03; 365/233; 365/190
(58) Field of Classification Search .................. 365/210, 365/230.03, 233, 190
See application file for complete search history.

(56) References Cited

U.S. PATENT DOCUMENTS

| | | | | |
|---|---|---|---|---|
| 5,268,869 A | * | 12/1993 | Ferris et al. ................. | 365/210 |
| 5,408,438 A | * | 4/1995 | Tanaka et al. ............... | 365/203 |
| 5,886,939 A | * | 3/1999 | Choi et al. ................... | 365/210 |

FOREIGN PATENT DOCUMENTS

| | | |
|---|---|---|
| JP | 07093972 A | 4/1995 |
| JP | 11339476 A | 12/1999 |

* cited by examiner

*Primary Examiner*—Huan Hoang
(74) *Attorney, Agent, or Firm*—Arent Fox PLLC

(57) ABSTRACT

A plurality of dummy bit lines are disposed together with a plurality of bit line pairs in a memory cell array. In selectively driving a memory cell connected to the bit line pair, a timing control circuit controls the timing of the driving operation, based on signal change in the plural dummy bit lines, thereby detecting the influences of the process variation in a plurality of positions in the memory cell array. Thus, the influence of the process variation given to the operation of a semiconductor memory device can be further alleviated, compared with the case when one dummy bit line is used.

19 Claims, 8 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2002-365634, filed on Dec. 17, 2002, the entire contents of which are incorporated herein by reference.

BACKGROUND OF THE INVENTION

1. Field of the Invention

The present invention relates to a semiconductor memory device, and more particularly, the present invention is suitable for use in a self-timing semiconductor memory device that internally performs operation timing control.

2. Description of the Related Art

Conventionally, in a semiconductor memory such as a SRAM (static random access memory), process variation (variation among memory macros and variation among adjacent transistors, and so on) occurring in fabrication processes sometimes influenced the operation of the semiconductor memories.

A possible method for alleviating the influence given by the process variation to the operation of a semiconductor memory is a method of operating the semiconductor memory at a fixed operation timing with a sufficient timing margin, but the use of this method hinders a high-speed operation of the semiconductor memory.

In view of the above, there have been such semiconductor memories as described in, for example, Japanese Patent Laid-open No. Hei 7-93972 and Japanese Patent Laid-open No. Hei 11-339476. In these semiconductor memories, provided is a dummy bit line pair to which dummy memory cells are connected, and the operation timing is internally controlled through the use of the dummy bit line pair, thereby solving the above-stated problem. These semiconductor memories, which are called "self-timing memories", have achieved the alleviation of the influence given by the process variation to the operation while preventing the decrease in the operating speed.

FIG. 8 is a block diagram showing the configuration of a conventional self-timing memory. In FIG. 8, 81 denotes a memory cell array constituted of a plurality of memory cells, 83 denotes a decoder, 84 denotes a read/write amplifier, and 85 denotes a timing control circuit. The memory cell array 81 has at an end portion thereof a dummy memory cell column 82 constituted of dummy memory cells connected to a set of dummy bit lines (one dummy bit line pair).

For example, when an input signal INS including an address signal and so on is inputted from an external part and a read demand of data stored in a memory cell is given, the timing control circuit 85 outputs a control signal CTLA including address information for the selection of the memory cell to the decoder 83 based on the input signal INS. The timing control circuit 85 also outputs a control signal CTLB including a sense amplifier activating signal to the read/write amplifier 84.

The decoder 83 selectively activates a word line WLm (m, which is a suffix, is a natural number) according to the control signal CTLA supplied thereto. Consequently, the action of the memory cell selected by the activated word line WLm causes a change in potential of a bit line pair BLn /BLn (n, which is a suffix, is a natural number). Here, the bit line /BLn is a bit line complementary to the bit line BLn.

Further, the read/write amplifier 84 activates, according to the control signal CTLB supplied thereto, a not-shown sense amplifier provided therein to amplify the potential read to the bit line pair BLn, /BLn, and outputs it to an external part as data DT.

The self-timing memory is so configured that, in the above-described operation, the timing control for driving the word line WLm and the timing control for activating the sense amplifier in the read/write amplifier 84 are performed based on a signal DS supplied by one dummy bit line pair to which the dummy memory cells are connected.

For example, when it is judged based on the supplied signal DS that a potential in the dummy bit line pair has reached a predetermined potential, the activated sense amplifier activating signal is outputted to activate the sense amplifier in the read/write amplifier 84. Further, for example, after a predetermined period has passed after the potential in the dummy bit line pair has reached a predetermined potential, the activated word line WLm is inactivated to bring all the word lines WLm into a inactivated state.

Here, only one dummy bit line pair to which the dummy memory cells are connected is provided in the conventional self-timing memory, as shown in FIG. 8. Further, in recent years, the process variation in semiconductor memories has been giving a more significant influence to the operation of the semiconductor memories as the memory capacity is becoming larger and process technology is becoming more microscopic in response to the demand for higher performance.

Therefore, when the operation timing in a semiconductor memory is controlled through the use of one dummy bit line pair as in the conventional self-timing memory, the influence given by the process variation to the operation cannot be alleviated due to a large process variation and arbitrary (random) distribution thereof in the semiconductor memory. As a result, the influence of the process variation may possibly become significant.

Especially when a large number of bit line pairs are provided and the number of dummy memory cells acting on the dummy bit line pairs is extremely small (for example, two or the like) compared with the number of memory cells connected to each of the bit line pairs, it is very difficult to reliably alleviate the influence given by the process variation to the operation through the use of only one dummy bit line pair.

SUMMARY OF THE INVENTION

The present invention is made in view of the problems stated above. It is an object of the present invention to further alleviate the influence given by the process variation to the operation of a semiconductor memory device, thereby allowing appropriate control of the operation timing in the semiconductor memory device.

A semiconductor memory device of the present invention includes: a memory cell array having a plurality of dummy bit lines to which dummy memory cells different to each other are connected respectively and a plurality of bit lines to which memory cells different to each other are connected respectively; and a timing control circuit for controlling the timing of a driving operation. The timing control circuit controls the timing of the driving operation based on signals supplied from the plural dummy bit lines and selectively drives the memory cell connected to the bit lines. This makes it possible to extract the influences of the process variation in a plurality of positions in the memory cell array, thereby further alleviating the influence given by the process variation to the operation of the semiconductor memory device.

DETAILED DESCRIPTION OF THE PREFERRED EMBODIMENTS

Embodiments of the present invention will be hereinafter explained based on the drawings.

First Embodiment

Figure 1:
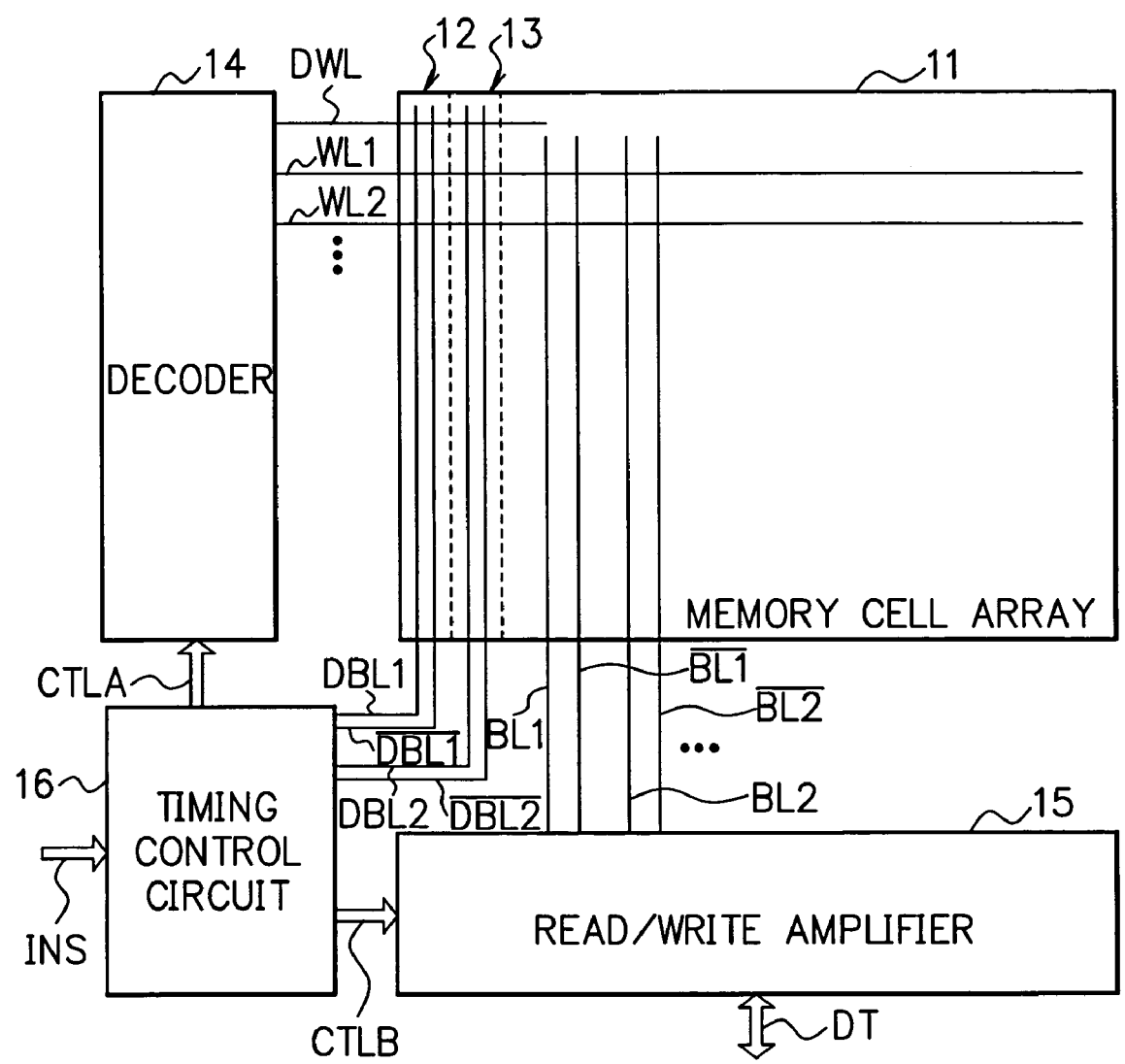
FIG. 1 is a block diagram showing a configuration example of a semiconductor memory device according to a first embodiment.

FIG. 1 is a block diagram showing a configuration example of a semiconductor memory device according to a first embodiment of the present invention. Note that, in the following explanation, a SRAM (static random access memory) is shown as an example of the semiconductor memory device, and a direction in which bit lines extend in a memory cell array is defined as a "column". Further, a reference symbol with "/" added to a reference symbol of a bit line (including a dummy bit line) denotes a complementary bit line (dummy bit line).

In FIG. 1, 11 denotes a memory cell array having a plurality of memory cells, and the plural memory cells are arranged, for example, in a matrix pattern. The memory cell array 11 has two dummy memory cell columns 12, 13. The dummy memory cell columns 12, 13 are adjacently disposed so as to be the closest to a later-described timing control circuit 16. More specifically, the dummy memory cell columns 12, 13 are disposed such that the wiring length thereof for connection to the timing control circuit 16 is shorter than that of the other memory cell columns (hereinafter, simply referred to as "memory cell columns") different from the dummy memory cell columns 12, 13.

Dummy memory cells in the dummy memory cell column 12 are connected to a set of dummy bit lines (one-dummy bit line pair) DBL1, /DBL1. Similarly, dummy memory cells in the dummy memory cell column 13 are connected to one dummy bit line pair DBL2, /DBL2 different from the dummy bit line pair DBL1, /DBL1. This means that two dummy bit line pairs, DBL1 and /DBL1, DBL2 and /DBL2 are provided in this embodiment.

14 denotes a decoder, to which one end of each of a dummy word line DWL and word lines WLm (m, which is a suffix, is a natural number) is connected. The decoder 14 drives the dummy word line DWL for activation or selectively drives any one of the word lines WLm for activation, based on a control signal CTLA supplied thereto from the timing control circuit 16.

15 denotes a read/write amplifier. The read/write amplifier 15 has a plurality of not-shown sense amplifiers and write amplifiers therein, and one end of each of the bit line pairs BLn, /BLn (n, which is a suffix, is a natural number) to which the memory cells are connected is connected to the read/write amplifier 15. Based on a control signal CTLB supplied from the timing control circuit 16, the read/write amplifier 15 activates the sense amplifier to amplify a potential read to the bit line pair BLn, /BLn, and outputs the amplified potential to an external part as data DT. The read/write amplifier 15 also activates the write amplifier based on the control signal CTLB and supplies the bit line pair BLn, /BLn with a potential according to data DT supplied from the external part.

The timing control circuit 16 outputs the control signals CTLA, CTLB based on an input signal INS (including an address signal, an access classification (read/write) signal, and so on) inputted thereto from an external part, thereby controlling the decoder 14 and the read/write amplifier 15 respectively. The timing control circuit 16, to which one end of each of the dummy bit line pair DBL1, /DBL1 and the dummy bit line pair DBL2, /DBL2 is connected, outputs the control signals CTLA, CTLB at an appropriate timing based on signals (potentials of the dummy bit line pairs and so on) supplied by the dummy bit line pairs.

Here, the control signal CTLA includes a row address signal, a command signal for the driving timing of the dummy word line DWL and the word lines WLm, and so on. The control signal CTLB includes a sense amplifier activating signal (sense amplifier enable signal) and a write amplifier activating signal (write amplifier enable signal) for activating the sense amplifier and the write amplifier respectively, and so on.

Figure 2A:
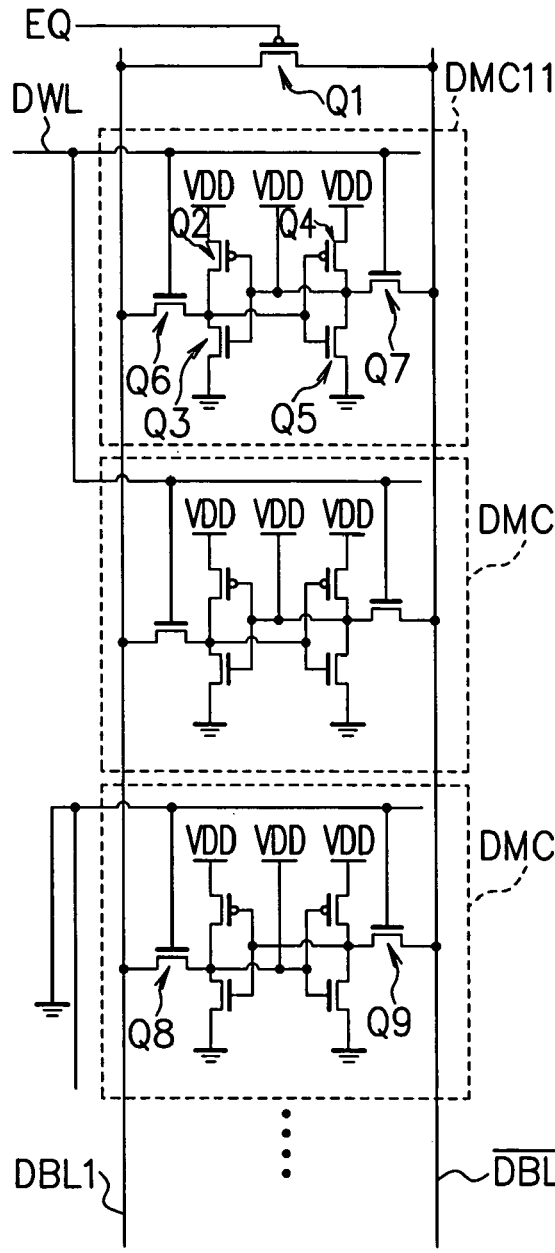
FIG. 2A and FIG. 2B are diagrams showing configuration examples of memory cells (dummy memory cells and regular memory cells)
Figure 2B:
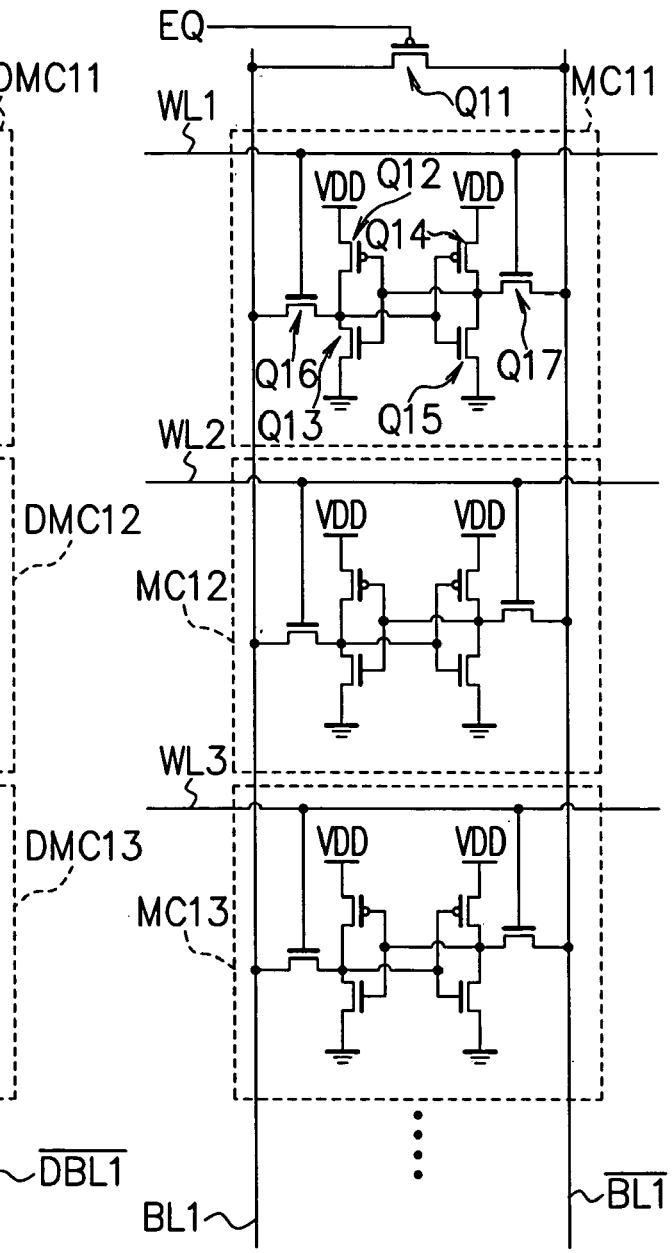

FIG. 2A and FIG. 2B are diagrams showing configuration examples of the memory cells, FIG. 2A showing a configuration example in the dummy memory cell column 12 and FIG. 2B showing a configuration example in the memory cell column different from the dummy memory cell columns 12, 13. Note that the dummy memory cell column 13 has the same configuration as that of the dummy memory cell column 12.

In FIG. 2A, DMC11, DMC12, DMC13, . . . denote dummy memory cells, and the dummy memory cell DMC11 is located at the most distant position from the timing control circuit 16 shown in FIG. 1, and the wiring length between the dummy memory cells DMC11, DMC12, DMC13, . . . and the timing control circuit 16 gets shorter in this order. In this embodiment, only the two dummy memory cells DMC11, DMC12 whose wiring length to the timing control circuit 16 is the largest and second largest (whose load is the largest and second largest) are used (driven), and the other dummy memory cells DMC13, . . . are not used. Note that the number of the dummy memory cells used (driven) in the dummy memory cell column is determined in advance based on a simulation and so on in a design process.

Since the dummy memory cells DMC11, DMC12 have the same configuration, the dummy memory cell DMC11 will be explained below.

Q2 and Q4 are p-channel MOS transistors, and Q3, Q5, Q6, and Q7 are n-channel MOS transistors.

Sources of the transistors Q2, Q4 are connected to power supply voltages VDD respectively, and sources of the transistors Q3, Q5 are connected to grounds (GND) respectively. A drain of the transistor Q2 and a drain of the transistor Q3 are connected to each other, and a drain of the transistor Q4 and a drain of the transistor Q5 are connected to each other. Gates of the transistors Q2, Q3 are connected to a junction point between the drains of the transistors Q4, Q5, and gates of the transistors Q4, Q5 are connected to a junction point between the drains of the transistors Q2, Q3. This means that the transistors Q2, Q3 and the transistors Q4, Q5 constitute inverters respectively, and input terminals and output terminals of the respective inverters are cross-coupled.

Sources of the transistors Q6, Q7 are connected to the junction point between the drains of the transistors Q2, Q3 and the junction point between the drains of the transistors Q4, Q5, respectively. Gates of the transistors Q6, Q7 are connected to the dummy word line DWL, and the drains of the transistors Q6, Q7 are connected to the dummy bit lines DBL1, /DBL1 respectively.

Further, the junction point between the drains of the transistors Q4, Q5 is connected to a power supply voltage VDD.

Each of the other dummy memory cells DMC13, . . . that are not used has the same configuration as that of the dummy memory cell DMC11 except that gates of n-channel MOS transistors Q8, Q9 corresponding to the respective transistors Q6, Q7 are connected to grounds (GND) respectively so as to constantly keep the transistors Q8, Q9 off and that a junction point between drains of transistors corresponding to the respective transistors Q2, Q3 is connected to a power supply voltage VDD.

Note that the p-channel MOS transistor Q1 is intended for equalizing potentials of the dummy bit lines DBL1, /DBL1, and is connected at its gate to a signal line for supplying an equalize signal EQ and is connected at its source and drain to the dummy bit lines DBL1, /DBL1 respectively.

In FIG. 2B, MC11, MC12, MC13, . . . denote memory cells for storing data. The memory cells MC11, MC12, MC13, . . . have the same configuration except that word lines WL1, WL2, WL3, . . . to which they are connected are different, and therefore, the memory cell MC11 will be explained below.

Q12 and Q14 are p-channel MOS transistors, and Q13, Q15, Q16, and Q17 are n-channel MOS transistors.

Sources of the transistors Q12, Q14 are connected to power supply voltages VDD respectively, and sources of the transistors Q13, Q15 are connected to grounds (GND) respectively. Drains of the transistors Q12, Q13 are connected to each other, and to a junction point therebetween, gates of the transistors Q14, Q15 are connected. Similarly, drains of the transistors Q14, Q15 are connected to each other, and to a junction point therebetween, gates of the transistors Q12, Q13 are connected. This means that input terminals and output terminals of inverters that are constituted of the transistors Q12, Q13 and the transistors Q14, Q15 respectively are cross-coupled.

Further, sources of transistors Q16, Q17 are connected to the junction point between the drains of the transistors Q12, Q13 and the junction point between the drains of the transistors Q14, Q15 respectively. Gates of the transistors Q16, Q17 are connected to the word line WL1, and drains of the transistors Q16, Q17 are connected to the bit lines BL1, /BL1 respectively.

Note that a p-channel MOS transistor Q11 is connected to a signal line for supplying an equalize signal EQ at its gate and is connected to the bit lines BL1, /BL1 at its source and drain respectively.

Figure 3B:
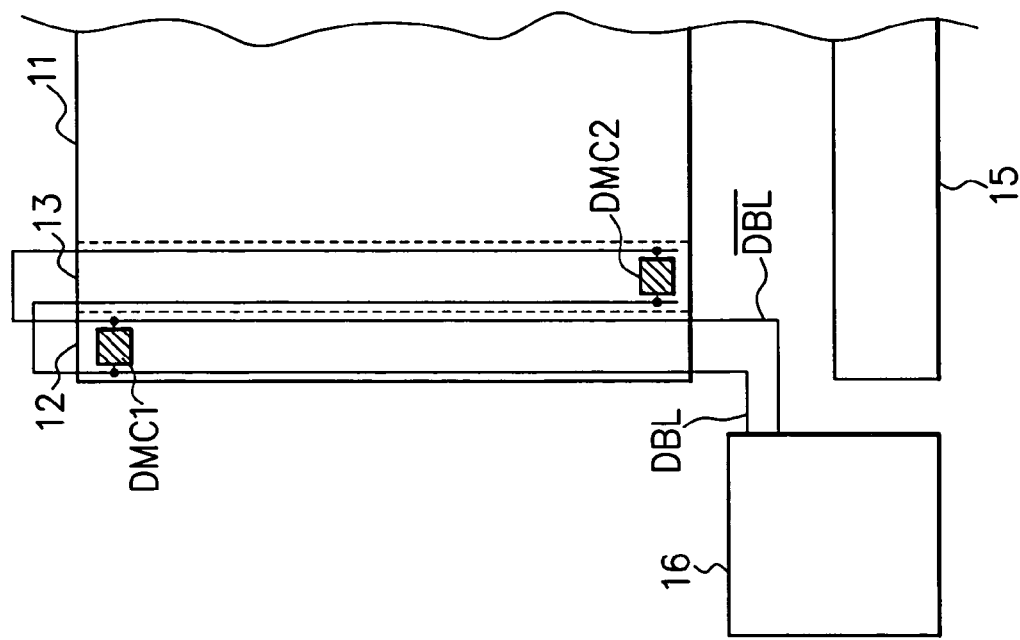
FIG. 3A and FIG. 3B are diagrams showing connection examples of a plurality of dummy bit lines.
Figure 3A:
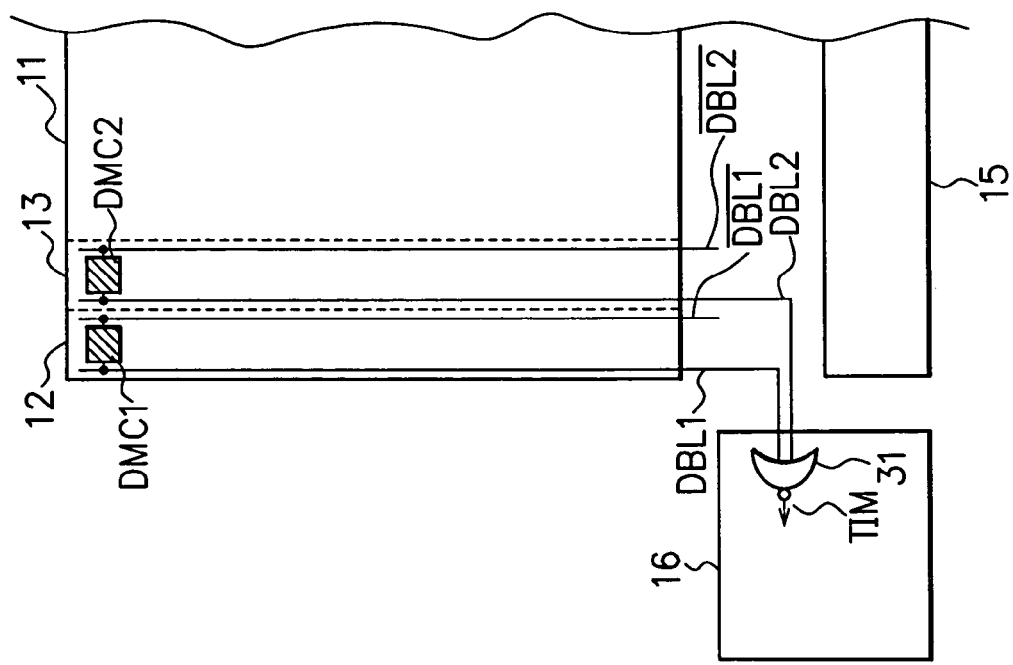

FIG. 3A and FIG. 3B are diagrams showing connection examples of dummy bit lines. In FIG. 3A and FIG. 3B, the same reference numerals and symbols are used to designate blocks and so on having the same functions as those of the blocks and so on shown in FIG. 1, and repeated explanation will be omitted.

FIG. 3A is a diagram showing an example where dummy bit lines of the dummy memory cell columns 12, 13 are connected to the timing control circuit 16.

Here, the control of the operation timing using a dummy bit line pair in a SRAM is generally performed by detecting potential change in a dummy bit line to which an output of an inverter in a dummy memory cell is connected, the inverter being on a side to which a high potential is inputted. Therefore, in each of the dummy bit line pair DBL1, /DBL1 and the dummy bit line pair DBL2, /DBL2, it is only necessary to use at least one of the dummy bit lines in which potential change occurs at the time of the operation, and thus, the dummy bit lines DBL1, DBL2 (it is assumed that a high-to-low level potential change occurs at the time of the operation) are connected to the timing control circuit 16 in FIG. 3A.

In FIG. 3A, DMC1 and DMC2 are dummy memory cells, which are a predetermined number of dummy memory cells selected from the dummy memory cells connected to the dummy bit line pair DBL1 and /DBL1 and the dummy bit line pair DBL2 and /DBL2 respectively, the selection being made in descending order of the wiring length to the timing control circuit 16.

31 denotes a negative-OR (NOR) circuit, having input terminals to which the dummy bit lines DBL1, DBL2 are connected respectively. The NOR circuit 31 outputs an arithmetic result as a timing generating signal TIM.

In the connection state of the dummy bit lines as shown in FIG. 3A, the timing generating signal TIM changes from a low level to a high level after the potentials of the dummy bit lines DBL1, DBL2 have both reached a low level (at a logical threshold voltage of the NOR circuit 31 or less). In other words, when all the potentials of the dummy bit lines DBL1, DBL2 become equal to or lower than a predetermined potential, the signal level of the timing generating signal TIM is inverted. Specifically, in the dummy bit lines DBL1, DBL2, the dummy bit line in which the signal (potential) change is the slowest is selected, and the timing generating signal TIM changes based on the selected dummy bit line, so that operation stability can be realized.

FIG. 3B is a diagram showing an example where the respective dummy bit lines of the dummy memory cell columns 12, 13, which are connected in series, are connected to the timing control circuit 16.

When the dummy bit lines are connected in series as shown in FIG. 3B, they are connected in series in such a manner that the relationship (complementary relationship) in the dummy bit line pair of the dummy memory cell column 12 becomes the same as that of the dummy bit line pair of the dummy memory cell column 13, and one end of the dummy bit line pair DBL, /DBL after this connection is connected to the timing control circuit 16. Further, as the dummy memory cells DMC1, DMC2, a predetermined number of dummy memory cells are selected in the dummy memory cell columns 12, 13 respectively in descending order of the wiring length in the dummy bit line pair DBL, /DBL to the timing control circuit 16.

In connecting the dummy bit lines as shown in FIG. 3B, it is only necessary to connect the dummy bit line pairs of the dummy memory cell columns 12, 13 in series in such a manner that the relationship in both of the dummy bit line pairs becomes the same. Therefore, it is not necessary to provide a circuit element such as the NOR circuit 31 shown in FIG. 3A in the timing control circuit 16. This allows the simplification of the circuit configuration compared with the connection example shown in FIG. 3A.

Next, the operation will be explained.

Figure 4:
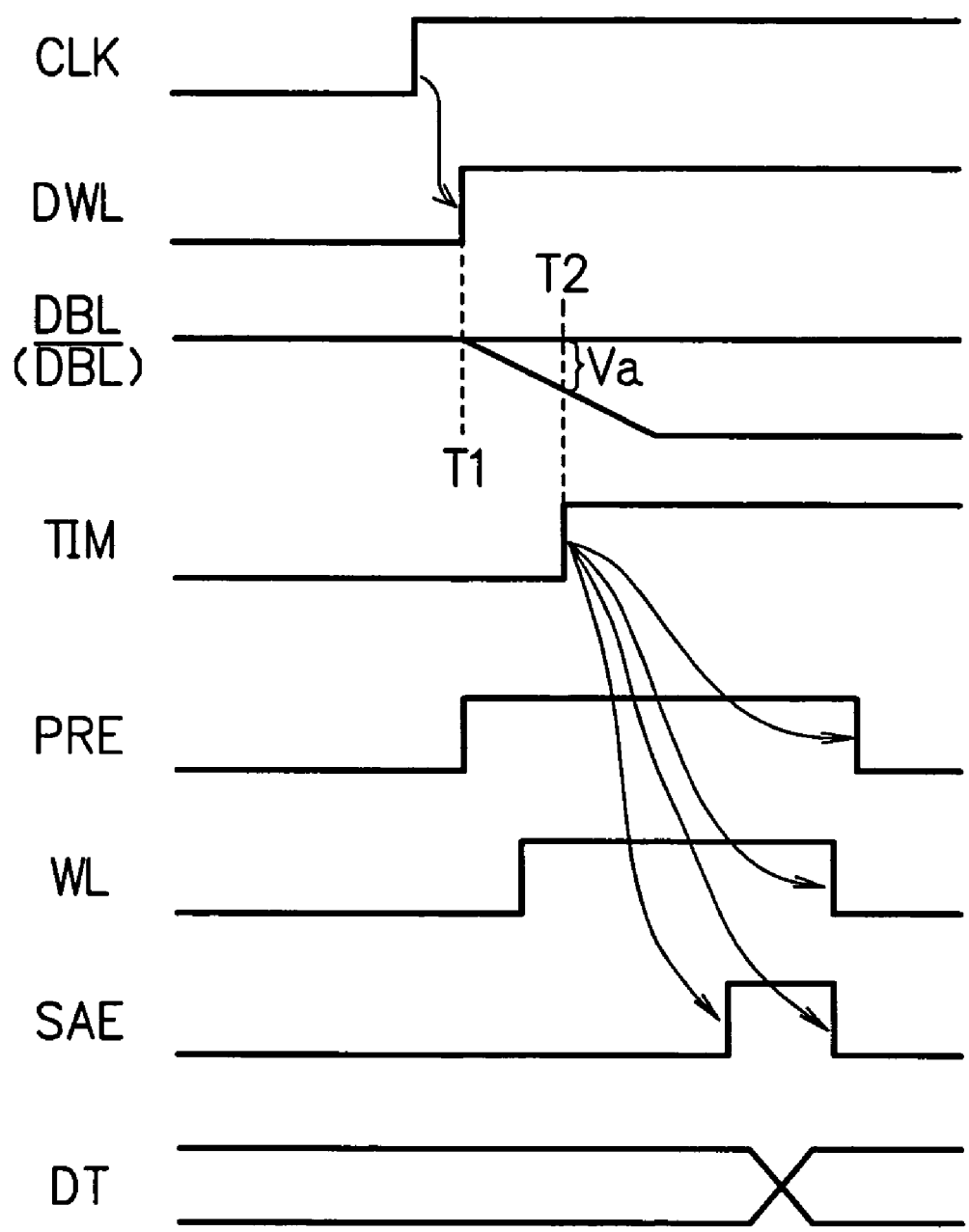
FIG. 4 is a timing chart showing an example of the operation in the semiconductor memory device according to the first embodiment.

FIG. 4 is a timing chart showing a read operation in the semiconductor memory device according to this embodiment. In FIG. 4, CLK denotes a clock signal, TIM denotes a timing generating signal, SAE denotes a sense amplifier activating signal, and DT denotes a data signal. Further, DWL, DBL (/DBL), and WL are waveforms indicating potential changes in a dummy word line, a dummy bit line, and a word line respectively.

First, when the input signal INS for a read access demand to a memory cell is inputted from an external part and the clock signal CLK rises, a precharge signal PRE in the control signal CTLB is inactivated (changed to a high level) and outputted to the read/write amplifier 15 by the timing control circuit 16. This causes the bit lines BLn, /BLn to be in a floating state. Incidentally, it is assumed that the bit lines BLn, /BLn are precharged to the power supply voltage VDD before the precharge signal PRE is inactivated.

The timing control circuit 16 also outputs the control signal CTLA to the decoder 14 to command the activation of the dummy word line DWL. The dummy word line DWL is activated (changed to a high level) by the decoder 14 according to the control signal CTLA (time T1).

Consequently, the transistors Q6, Q7 are turned on in the dummy memory cells DMC11, DMC12 shown in FIG. 2A. Here, the transistors Q3, Q4 in the dummy memory cells DMC11, DMC12 are constantly kept turned on, and the transistors Q2, Q5 are constantly kept turned off. Therefore, when the transistors Q6, Q7 are turned on, the potential of the dummy bit line DBL becomes lower from the power supply voltage VDD (the lowest potential is GND) with the elapse of time, and the potential of the dummy bit line /DBL is maintained at the power supply voltage VDD, as shown in FIG. 4.

Then, when a potential difference between the potential of the dummy bit line DBL and the power supply voltage VDD becomes larger than a predetermined potential difference Va, the timing generating signal TIM is activated (changed to the high level) (time T2).

Meanwhile, after inactivating the precharge signal PRE, the timing control circuit 16 outputs to the decoder 14 the control signal CTLA including address information (row address) for selecting a memory cell. One of the word lines WL is selectively activated (changed to a high level) by the decoder 14 based on the supplied control signal CTLA. With this operation, transistors corresponding to the transistors Q16, Q17 shown in FIG. 2B are turned on in a memory cell connected to the activated word line WL, and a potential (data) is read to the bit line pair BLn, /BLn. Incidentally, the time at which the word line WL is selectively activated may be the same as the time at which the dummy word line DWL is selectively activated or they may be different from each other.

After the timing generating signal TIM is activated and a predetermined period of time has passed, the sense amplifier activating signal SAE in the control signal CTLB is activated (changed to a high level) and outputted to the read/write amplifier 15 by the timing control circuit 16. Consequently, the sense amplifier in the read/write amplifier 15 is activated to amplify the potential read to the bit line pair BLn, /BLn, and outputs the amplified potential to an external part as the data DT.

After a predetermined time has further passed, the timing control circuit 16 inactivates the sense amplifier activating signal SAE to output it to the read/write amplifier 15, thereby inactivating the sense amplifier in the read/write amplifier 15. The timing control circuit 16 also gives a command for the inactivation of the word line WL to the decoder 14, so that all the word lines WL are inactivated. Further, the timing control circuit 16 activates the precharge signal PRE to output it to the read/write amplifier 15. Thereafter, the timing control circuit 16 gives the decoder 14 a command for the inactivation of the dummy word line DWL, so that the dummy word line DWL is inactivated.

Consequently, both of the bit lines BLn, /BLn are precharged at the power supply voltage VDD for the next operation. At this time, the potential difference between the potential of the dummy bit line DBL and the power supply voltage VDD becomes smaller than the predetermined potential difference Va to inactivate the timing generating signal TIM. In the above-described manner, the read operation is executed.

A write operation is controlled in the same manner as the above-described read operation except that a write amplifier activating signal WAE in the control signal CTLB is activated irrespective of the timing generating signal TIM to activate the write amplifier in the read/write amplifier 15, a potential according to the data DT supplied from an external part is supplied to the bit line pair BLn, /BLn, and the write amplifier activating signal WAE is inactivated based on the timing generating signal TIM. Therefore, explanation of the write operation will be omitted.

According to this embodiment explained above in detail, the two dummy bit line pairs DBL1 and /DBL1, DBL2 and /DBL2 are adjacently disposed in the memory cell array 11 so as to be the closest to the timing control circuit 16, together with the plural bit line pairs BLn, /BLn. The timing control circuit 16 controls the driving timing of each signal for use in accessing a memory cell connected to the bit line pair BLn, /BLn, based on signal change in the dummy bit line pairs DBL1, DBL2 (/DBL1, /DBL2).

In this manner, it is possible to control the driving timing of the memory cell by detecting the influence of the process variation in two positions in the memory cell array 11 through the use of the two dummy bit line pairs DBL1, DBL2 (/DBL1, /DBL2). This alleviates the influence given by the process variation to the operation of the semiconductor memory device, compared with the case when only one dummy bit line pair is used, which allows appropriate control of the driving timing.

Further, the two dummy bit line pairs DBL1 and /DBL1, DBL2 and /DBL2 are disposed so as to be the closest to the timing control circuit 16. Consequently, the transmission of the potential change in the dummy bit line pairs DBL1, DBL2 (/DBL1, /DBL2) to the timing control circuit 16 is faster than that when they are arranged in other positions in the memory cell array 11, which is highly suitable for the high-speed operation.

Incidentally, the case when the two dummy bit line pairs DBL1, DBL2 are used is explained in this embodiment, but the number of the dummy bit line pairs in the present invention is not limited to two, but may be three or more.

FIG. 5A to FIG. 5D are block diagrams showing other configuration examples of the semiconductor memory device according to the first embodiment. In FIG. 5A to FIG. 5D, the same reference numerals and symbols are used to designate blocks and so on having the same functions as those of the blocks and so on shown in FIG. 1, and repeated explanation will be omitted. Further, the same reference numerals and symbols with an apostrophe (') added thereto are used to designate blocks and so on having functions corresponding to, though not the same as, the functions of the blocks and so on shown in FIG. 1. Further, in FIG. 5A to FIG. 5D, signals exchanged between function blocks, word lines (including dummy word lines), and bit lines (including dummy bit lines) are the same as those in the semiconductor memory device shown in FIG. 1, and therefore, they are omitted.

Figure 5A:
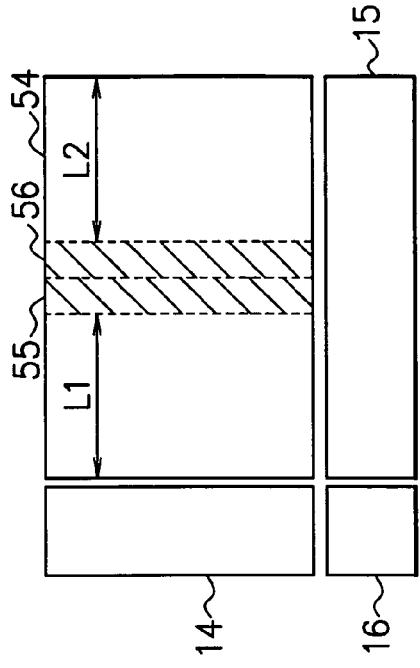
FIG. 5A to FIG. 5D are block diagrams showing other configuration examples of the semiconductor memory device according to the first embodiment.

In FIG. 5A, dummy memory cell columns 52, 53 (dummy bit line pairs DBL1 and /DBL1, DBL2 and /DBL2) are adjacently disposed in the memory cell array 51 so that the distance thereof from the timing control circuit 16 is longer (the wiring length thereof is longer) than that of other memory cell columns. In other words, the dummy memory cell columns 52, 53 are disposed in the memory cell array 51 so as to be the most distant from the timing control circuit 16.

The two dummy memory cell columns (dummy bit line pairs) are disposed at positions the most distant from the timing control circuit 16 in the memory cell array 51 as shown in FIG. 5A, so that it is possible to alleviate the influence given by the process variation to the operation of the semiconductor memory device, which allows appropriate control of the driving timing. In addition, since the transmission of the potential change in the dummy bit line pairs to the timing control circuit 16 is slower than that when the two dummy memory cell columns are disposed at other positions in the memory cell array 51, it is possible to set an appropriate and sufficient timing margin, so that more reliable driving of a memory cell can be realized.

Figure 5B:
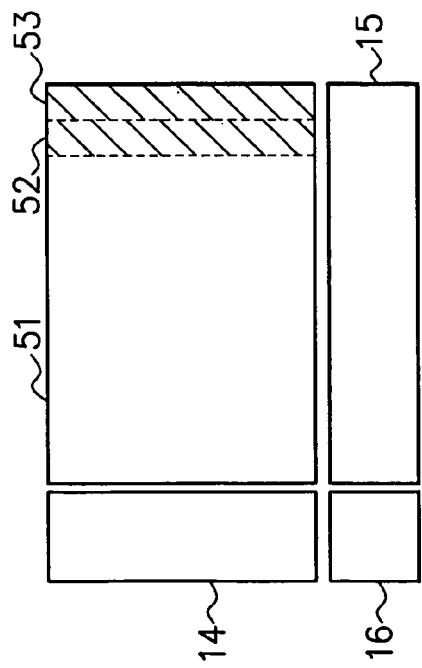

In FIG. 5B, dummy memory cell columns 55, 56 (dummy bit line pairs DBL1 and /DBL1, DBL2 and /DBL2) are adjacently disposed in a center portion of a memory cell array 54 so that distances L1 and L2 are substantially equal to each other.

With the arrangement as shown in FIG. 5B, it is possible to alleviate the influence given by the process variation to the operation of the semiconductor memory device, which allows appropriate control of the driving timing. In addition, the semiconductor memory device can be configured to be excellent both in high speed operation and reliability in the memory cell driving.

Figure 5C:
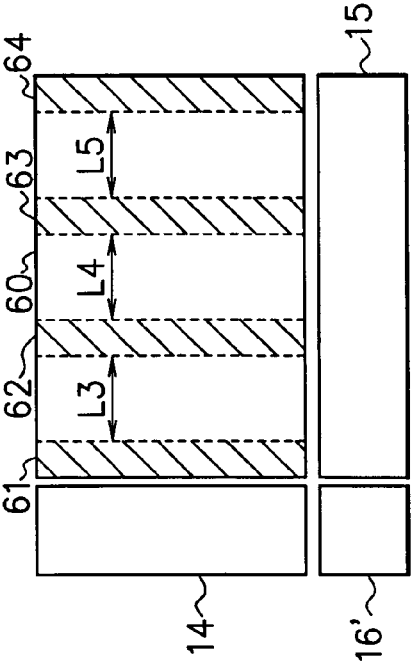

In FIG. 5C, a dummy memory cell column 58 (for example, a dummy bit line pair DBL1 and /DBL1) is disposed in a memory cell array 57 so that the wiring length thereof to the timing control circuit 16 is shorter than that of other memory cell columns different from the dummy memory cell column 58. Further, a dummy memory cell column 59 (for example, a dummy bit line pair DBL2 and /DBL2) is disposed in the memory cell array 57 so that the wiring length thereof to the timing control circuit 16 is longer than that of other memory cell columns different from the dummy memory cell column 59.

The two dummy memory cell columns (dummy bit line pairs) are disposed at positions on both ends of the memory cell array 57 as shown in FIG. 5C, so that it is possible to alleviate the influence given by the process variation to the operation of the semiconductor memory device, which allows appropriate control of the driving timing. In addition, it is possible to selectively drive a memory cell in accordance with the difference in element characteristics between both ends of a memory cell array, the difference in element characteristics being considered to easily occur, for example, in a memory cell array having a large number of memory cell columns and having a large memory capacity.

Figure 5D:
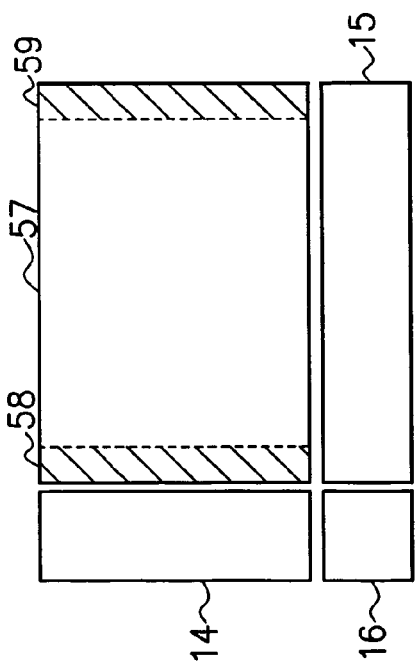

In FIG. 5D, dummy memory cell columns 61, 62, 63, 64 (four dummy bit line pairs) are disposed in a memory cell array 60 so that distances L3, L4, L5 are substantially equal.

In other words, the dummy memory cell columns 61 to 64 are disposed in the memory cell array 60 at a predetermined pitch.

The dummy memory cell columns (dummy bit line pairs) are disposed in the memory cell array 60 at a predetermined pitch as shown in FIG. 5D, so that it is possible to absorb the difference in element characteristics in the memory cell array to a larger extent than in the semiconductor memory devices shown in FIG. 1 and FIG. 5A to FIG. 5C respectively. This makes it possible to further alleviate the influence given by the process variation to the operation of the semiconductor memory device, which allows appropriate control of the driving timing.

Figure 6:
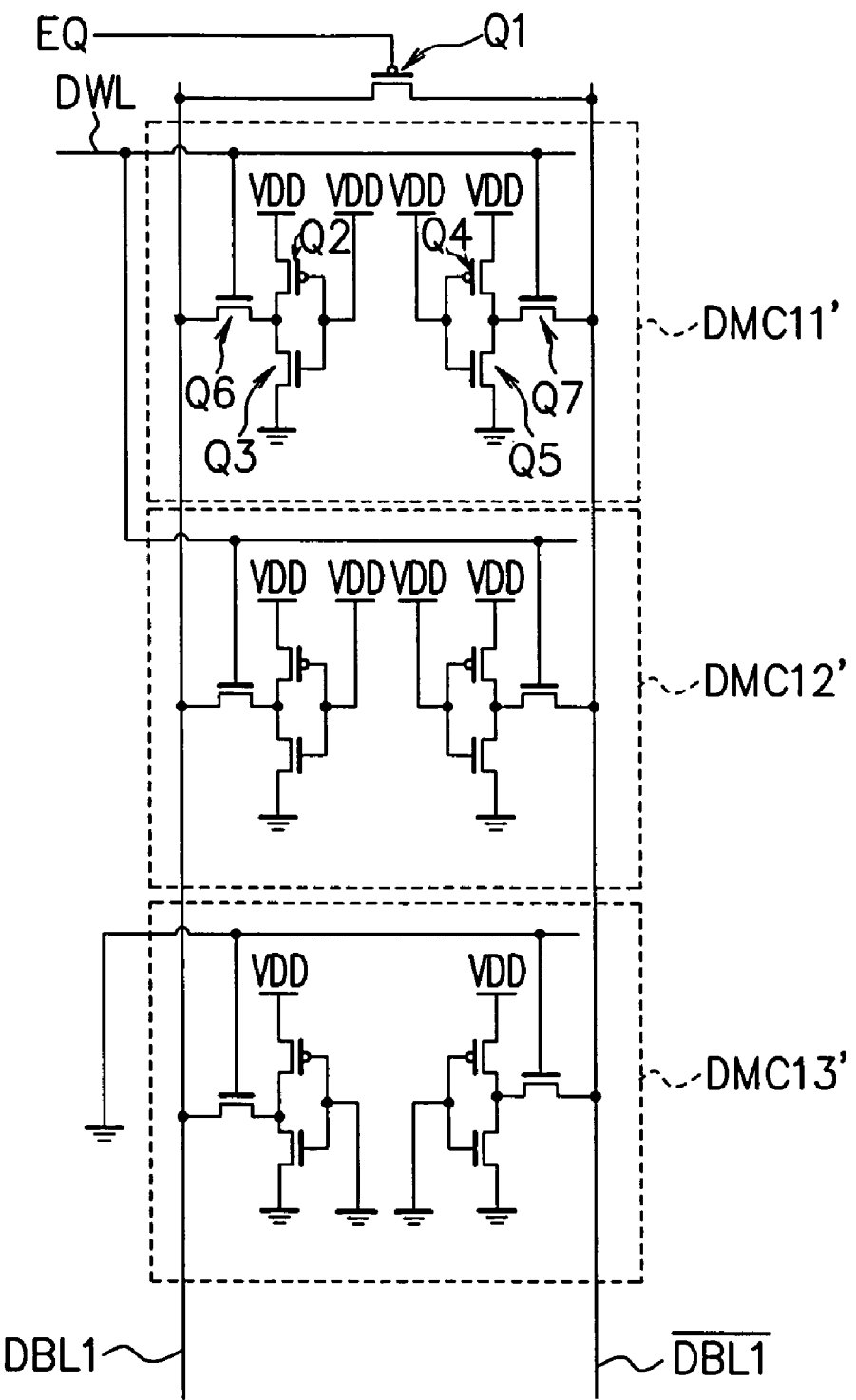
FIG. 6 is a diagram showing another configuration example of the dummy memory cells.

FIG. 6 is a diagram showing another configuration example of the dummy memory cells. In FIG. 6, the same reference numerals and symbols are used to designate components (circuit elements) and so on having the same functions as those of the components and so on shown in FIG. 2A, and repeated explanation will be omitted.

In the dummy memory cells DMC11, DMC12 shown in FIG. 2A, the gates of the transistors Q2, Q3 are connected to the junction point between the drains of the transistors Q4, Q5, and the gates of the transistors Q4, Q5 are connected to the junction point between the drains of the transistors Q2, Q3.

On the other hand, in dummy memory cells DMC11', DMC12' shown in FIG. 6, gates of transistors Q2, Q3 are connected to power supply voltages VDD respectively, and gates of transistors Q4, Q5 are similarly connected to power supply voltages VDD respectively. This means that, in the dummy memory cells DMC11', DMC12', input terminals and output terminals of inverters constituted of the transistors Q2, Q3, and Q4, Q5 are not cross-coupled, but these inverters are operated independently.

Further, in a dummy memory cell DMC13', input terminals and output terminals of inverters each constituted of two transistors are not cross-coupled but the respective input terminals are grounded.

With the arrangement of the dummy memory cell columns as shown in FIG. 6, both dummy bit lines in the dummy bit line pair DBL1, /DBL1 can be utilized as a dummy bit line used for controlling the driving timing of each signal in accessing a memory cell, so that the driving timing of each signal can be controlled based on signal change in these dummy bit lines. Therefore, the same effect as that when two dummy bit line pairs are used can be obtained with one dummy bit line pair that requires a half an area, thereby realizing the reduction in the circuit area.

Second Embodiment

Next, a second embodiment of the present invention will be explained.

The semiconductor memory device according to the first embodiment described above has one memory cell array, but a semiconductor memory device according to the second embodiment to be explained below has a plurality of memory cell arrays.

Figure 7A:
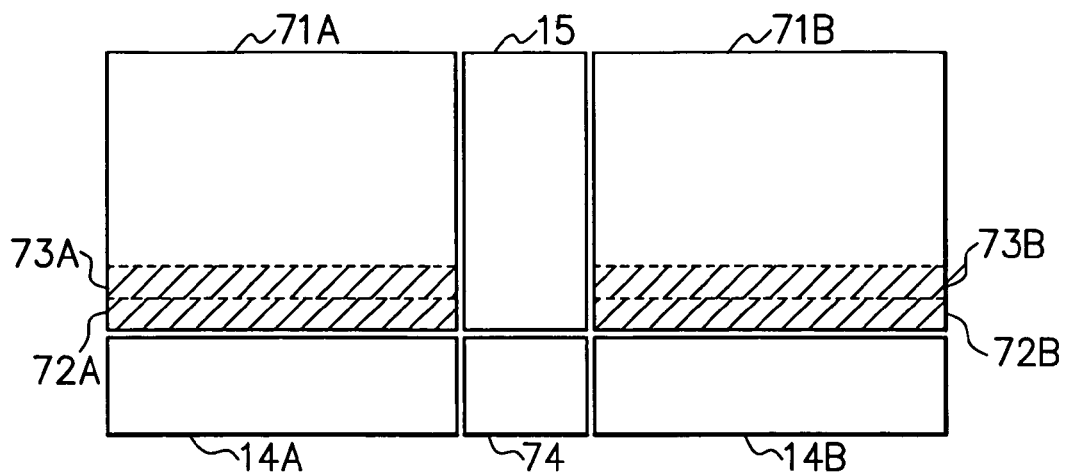
FIG. 7A to FIG. 7C are block diagrams showing configuration examples of a semiconductor memory device according to a second embodiment.
Figure 7B:
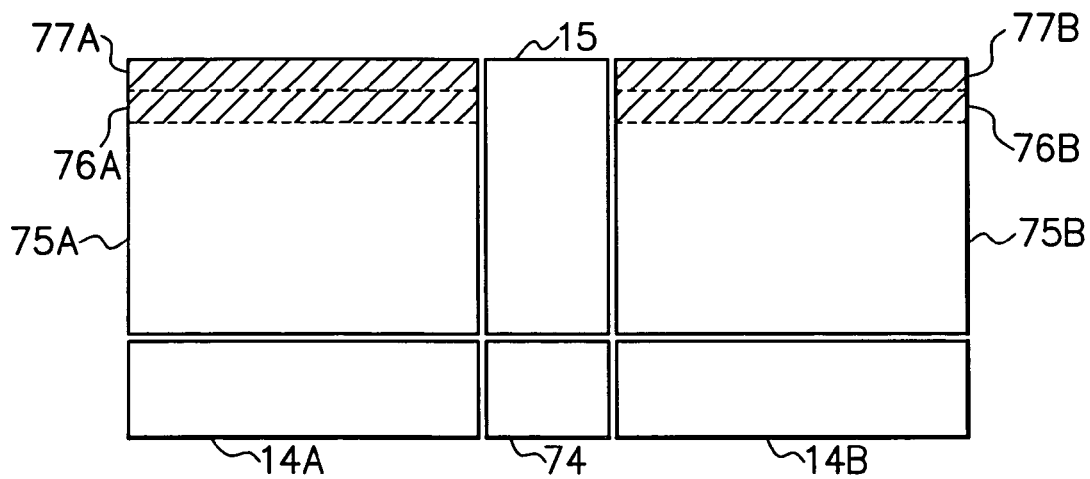
Figure 7C:
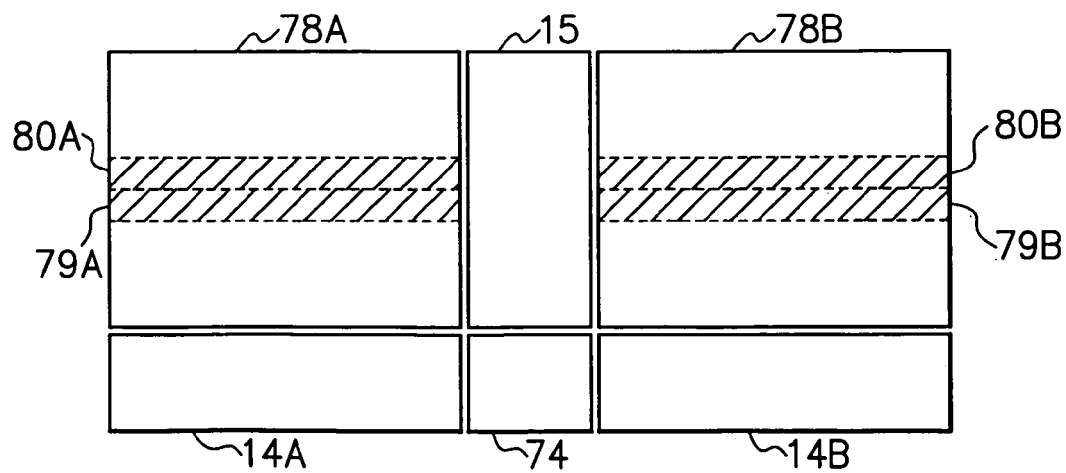
Figure 8:
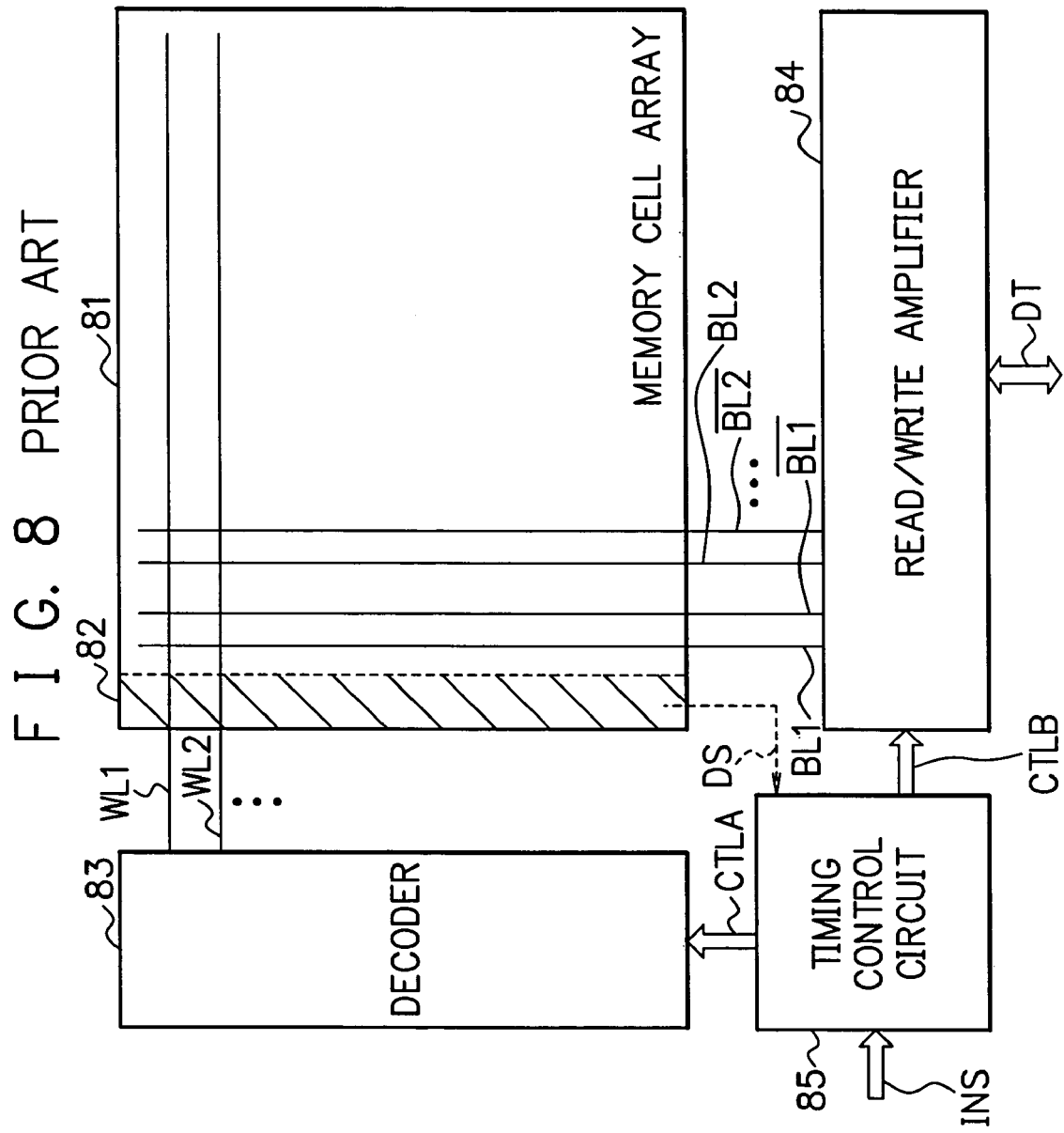
FIG. 8 is a block diagram showing the configuration of a conventional self-timing memory.

FIG. 7A to FIG. 7C are block diagrams showing configuration examples of the semiconductor memory device according to the second embodiment of the present invention. Signals exchanged between function blocks, word lines (including dummy word lines), and bit lines (including dummy bit lines) in FIG. 7A to FIG. 7C are the same as those of the semiconductor memory device according to the first embodiment described above, and therefore they are omitted.

In FIG. 7A, 71A and 71B denote memory cell arrays, and 14A and 14B denote decoders. The decoders 14A, 14B are provided so as to correspond to the respective memory cell arrays 71A, 71B. Further, 74 denotes a timing control circuit and 15 denotes a read/write amplifier.

The memory cell array 71A has two dummy memory cell columns 72A, 73A that are adjacently disposed so that the wiring length thereof to the timing control circuit 74 is shorter than that of other memory cell columns in the memory cell array 71A. Similarly, the memory cell array 71B has two dummy memory cell columns 72B, 73B that are adjacently disposed so that the wiring length thereof to the timing control circuit 74 is shorter than that of other memory cell columns in the memory cell array 71B.

One end of each of dummy bit line pairs to which dummy memory cells in the dummy memory cell columns 72A, 73A are connected is connected to the timing control circuit 74. Further, one end of each of dummy bit line pairs to which dummy memory cells in the dummy memory cell columns 72B, 73B are connected is connected to the timing control circuit 74.

The memory cell arrays 71A, 71B, the decoders 14A, 14B, the read/write amplifier 15, and the timing control circuit 74 are the same as the memory cell array 11, the decoder 14, the read/write amplifier 15, and the timing control circuit 16 respectively in the above-described first embodiment, and therefore, explanation on functions, operations, and so on of the respective blocks will be omitted.

In a semiconductor memory device shown in FIG. 7B, two dummy memory cell columns 76A, 77A, and 76B, 77B are adjacently disposed in memory cell arrays 75A, 75B respectively so that the wiring length to the timing control circuit 74 is longer than that of other memory cell columns, contrary to the semiconductor memory device shown in FIG. 7A.

Note that the decoders 14A, 14B are provided to correspond to the respective memory cell arrays 75A, 75B. Similarly to the case shown in FIG. 7A, one end of each of dummy bit line pairs to which dummy memory cells in the dummy memory cell columns 76A, 77A are connected is connected to the timing control circuit 74, and further, one end of each of dummy bit line pairs to which dummy memory cells in the dummy memory cell columns 76B, 77B are connected is connected to the timing control circuit 74.

A semiconductor memory device shown in FIG. 7C is so designed that two dummy memory cell columns 79A, 80A are adjacently disposed in a center portion of a memory cell array 78A, and two dummy memory cell columns 79B, 80B are adjacently disposed in a center portion of a memory cell array 78B.

Decoders 14A, 14B are provided to correspond to the respective memory cell arrays 78A, 78B. One end of each of dummy bit line pairs to which dummy memory cells in the dummy memory cell columns 79A, 80A are connected is connected to the timing control circuit 74. Further, one end of each of dummy bit line pairs to which dummy memory cells in the dummy memory cell columns 79B, 80B are connected is connected to the timing control circuit 74.

With the arrangements as shown in FIG. 7A to FIG. 7C, the same effects as those of the semiconductor memory devices in the above-described first embodiment shown in FIG. 1, FIG. 5A, and FIG. 5B respectively can be obtained.

Incidentally, it is of course possible to adopt such arrangement, though not shown, that the two dummy memory cell columns (dummy bit line pairs) are disposed at positions on both ends of each of the memory cell arrays as shown in FIG. 5C, or that the dummy memory cell columns (dummy bit line pairs) are disposed at a predetermined pitch in each of the memory cell arrays as shown in FIG. 5D. With such arrangement, the same effects as those of the respective semiconductor memory devices shown in FIG. 5C and FIG. 5D are obtainable respectively.

Incidentally, in the above-described embodiments, the case when the number of the dummy bit line pairs that each of the memory cell arrays has is two (FIG. 1, FIG. 5A to FIG. 5C, and FIG. 7A to FIG. 7C) or the case when it is four (FIG. 5D) is shown. The present invention, however, is not limited to this, and the number of the dummy bit line pairs that each of the memory cell arrays has is an arbitrary plural number.

Here, for example, in order to dispose the dummy bit line pairs on both ends of a memory cell array respectively as shown in FIG. 5C, a plurality of dummy bit line pairs are divided into two sets, each consisting of a substantially equal number of dummy bit line pairs (when one set has n pieces of dummy bit line pairs, the other set has (n±1) pieces), and the respective sets of the dummy bit line pairs are disposed on both ends of the memory cell array. Further, for example, when the plural dummy bit line pairs are arranged in a memory cell array at a predetermined pitch as shown in FIG. 5D, one dummy bit line pair may be disposed at every predetermined pitch, or a plurality of dummy bit lines as one set may be disposed at every predetermined pitch.

Further, in the above-described embodiments, the dummy bit line pairs are used in controlling the driving timing of a memory cell since the SRAM is explained as one example. However, the same effects as those brought about by the above-described embodiments can be obtained by using a dummy bit line when one memory cell is connected to one bit line, and by using a dummy bit line pair when one memory cell is connected to two bit lines, namely, one bit line pair. Incidentally, when the dummy bit line pair is used, one of the dummy bit lines may be used or both of the dummy bit lines may be used, as described above.

Further, in the above-described embodiments, the SRAM is used as one example of the semiconductor memory device for explanation. However, the present invention is not limited to be applied to the SRAM, but is applicable to any semiconductor memory device such as a semiconductor memory using a memory cell array having bit lines (for example, a DRAM (dynamic random access memory)).

As explained hitherto, according to the present invention, a plurality of dummy bit lines to which dummy memory cells different from each other are connected are disposed together with a plurality of bit lines to which memory cells different from each other are connected in a memory cell array, and a timing control circuit controls the timing of the driving operation in selectively driving a memory cell, based on signals supplied via the plural dummy bit lines. This makes it possible to control the driving operation timing in selectively driving the memory cell, in accordance with the influences of the process variation in a plurality of positions in the memory cell array through the use of the plural dummy bit lines. As a result, compared with the case when only one dummy bit line is used, it is possible to further alleviate the influence given by the process variation to the operation of a semiconductor memory device, which allows appropriate control of the operation timing.

It should be noted that the present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor memory device selectively driving memory cells in accordance with an input signal inputted from an external part to output data or to input and output data, said semiconductor memory device comprising:
   a memory cell array having a plurality of dummy bit line pairs and a plurality of bit line pairs adjacently disposed to each other, dummy memory cells being connected to said dummy bit line pairs respectively, and memory cells being connected to said bit line pairs respectively; and
   a timing control circuit controlling a timing of a driving operation based on signals supplied via said dummy bit line pairs, when selectively driving the memory cell connected to said bit line pair.

2. The semiconductor memory device according to claim 1, wherein, in said memory cell array, said dummy bit line pairs are adjacently disposed at positions closer to said timing control circuit than an arbitrary one of said bit line pairs.

3. The semiconductor memory device according to claim 1, wherein, in said memory cell array, said dummy bit line pairs are adjacently disposed at positions more distant from said timing control circuit than an arbitrary one of said bit line pairs.

4. The semiconductor memory device according to claim 1, wherein, in said memory cell array, said dummy bit line pairs are adjacently disposed and said bit line pairs are disposed on both sides of said dummy bit line pairs adjacently disposed.

5. The semiconductor memory device according to claim 1, wherein, in said memory cell array, said dummy bit line pairs are divided into two sets, and the dummy bit line pairs in one of the sets are adjacently disposed at a position closer to said timing control circuit than an arbitrary one of the bit line pairs and the dummy bit line pairs in the other set are adjacently disposed at a position more distant from said timing control circuit than an arbitrary one of the bit line pairs.

6. The semiconductor memory device according to claim 5, wherein said dummy bit line pairs are divided into two sets, one set consisting of N pieces (N is a natural number) of the dummy bit line pairs and the other set consisting of N pieces or (N+1) pieces of the dummy bit line pairs.

7. The semiconductor memory device according to claim 1, wherein, in said memory cell array, said dummy bit line pairs are disposed at a predetermined pitch.

8. The semiconductor memory device according to claim 1, wherein, in said memory cell array, said dummy bit line pairs are divided into a plurality of sets each consisting of a substantially equal number of dummy bit line pairs, the dummy bit line pairs in each of the sets being adjacently disposed, and the plural sets of the dummy bit line pairs being disposed at a predetermined pitch.

9. The semiconductor memory device according to claim 1, wherein said memory cell array is provided in plurality.

10. The semiconductor memory device according to claim 1, wherein said dummy bit line pairs are connected in series.

11. The semiconductor memory device according to claim 10, wherein said timing control circuit generates a timing generating signal based on the signals supplied via said dummy bit line pairs and controls the timing of the driving operation based on the generated timing generating signal.

12. The semiconductor memory device according to claim 1, wherein said timing control circuit controls the timing of the driving operation based on a signal supplied via a dummy bit line of said dummy bit line pairs with the slowest signal change among said dummy bit line pairs.

13. The semiconductor memory device according to claim 1, wherein said timing control circuit has a logical arithmetic circuit having an input terminal to which one end of each dummy bit line of said dummy bit line pairs are connected, and said logical arithmetic circuit inverts a signal level of an output signal in accordance with a change in the signals supplied via said dummy bit lines of said dummy bit line pairs.

14. The semiconductor memory device according to claim 1, wherein said timing control circuit controls the timing of the driving operation based on a potential difference between a potential of at least one dummy bit line of each of said dummy bit line pairs and a reference potential.

15. The semiconductor memory device according to claim 1, wherein each of said dummy memory cells and said memory cells has two inverter circuits, said two inverter circuits have input terminals and output terminals mutually cross-coupled, and the input terminals of the two inverter circuits in each of the dummy memory cells are further connected to power sources supplying predetermined voltages.

16. The semiconductor memory device according to claim 1, wherein each of the dummy memory cells and the memory cells has two inverter circuits, the two inverter circuits in each of the memory cells have input terminals and output terminals mutually cross-coupled, and the two inverter circuits in each of the dummy memory cells have input terminals connected to power sources supplying predetermined voltages respectively and output terminals connected to different dummy bit lines of said dummy bit line pairs respectively.

17. The semiconductor memory device according to claim 1, wherein a predetermined number of dummy memory cells are selectively driven among said dummy memory cells connected to said dummy bit line pairs respectively, the dummy memory cells being selected in descending order of a distance in said dummy bit line pairs from said timing control circuit.

18. The semiconductor memory device according to claim 1, wherein said timing control circuit controls the timing of the driving operation based on a signal supplied via at least one dummy bit line of said dummy bit line pairs.

19. The semiconductor memory device according to claim 1, wherein said memory cell array has a dummy word line for selectively driving a dummy memory cell connected to said dummy bit line pairs and a word line for selectively driving a memory cell connected to said bit line pairs.

* * * * *

UNITED STATES PATENT AND TRADEMARK OFFICE
CERTIFICATE OF CORRECTION

PATENT NO. : 6,996,020 B2
APPLICATION NO. : 10/720080
DATED : February 7, 2006
INVENTOR(S) : Katsuya Yoshida It is certified that error appears in the above-identified patent and that said Letters Patent is hereby corrected as shown below:

Title Page -

In (73) Assignee Information, please correct the Assignee's name as follows:

-- Fujitsu Limited, Kawasaki (JP) --.

Signed and Sealed this

Nineteenth Day of September, 2006

JON W. DUDAS
*Director of the United States Patent and Trademark Office*